US010741763B2

(12) United States Patent
Baek et al.

(10) Patent No.: US 10,741,763 B2
(45) Date of Patent: Aug. 11, 2020

(54) DIVISION MASK WITH CLAMPING PORTION

(71) Applicant: SAMSUNG DISPLAY CO., LTD., Yongin-si, Gyeonggi-do (KR)

(72) Inventors: Daewon Baek, Yongin-si (KR); Jongbum Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 5 days.

(21) Appl. No.: 15/672,662

(22) Filed: Aug. 9, 2017

(65) Prior Publication Data
US 2018/0065143 A1    Mar. 8, 2018

(30) Foreign Application Priority Data

Sep. 6, 2016    (KR) .................. 10-2016-0114309

(51) Int. Cl.
| | |
|---|---|
| *H01L 51/00* | (2006.01) |
| *H05K 3/12* | (2006.01) |
| *B05C 17/08* | (2006.01) |
| *B05C 21/00* | (2006.01) |
| *C23C 14/04* | (2006.01) |
| *H05B 33/10* | (2006.01) |
| *B05B 12/20* | (2018.01) |
| *B05D 1/32* | (2006.01) |

(52) U.S. Cl.
CPC .......... *H01L 51/0011* (2013.01); *B05C 17/08* (2013.01); *B05C 21/005* (2013.01); *B05D 1/32* (2013.01); *C23C 14/042* (2013.01); *H05K 3/1225* (2013.01); *B05B 12/20* (2018.02); *H01L 2251/56* (2013.01); *H05B 33/10* (2013.01)

(58) Field of Classification Search
CPC ....... B05C 21/005; B05C 17/08; C23C 14/04; C23C 14/042
See application file for complete search history.

(56) References Cited

U.S. PATENT DOCUMENTS

| | | | |
|---|---|---|---|
| 8,915,213 B2 | 12/2014 | Park | |
| 8,925,480 B2 | 1/2015 | Kim | |
| 9,187,817 B2 | 11/2015 | Kim | |
| 2003/0221614 A1* | 12/2003 | Kang | ................... C23C 14/042 118/504 |
| 2004/0183435 A1* | 9/2004 | Ohshita | ............... H01L 51/5246 313/506 |

(Continued)

FOREIGN PATENT DOCUMENTS

| | | | | |
|---|---|---|---|---|
| JP | 2003109499 A | * | 4/2003 | ............ H01J 9/0014 |
| KR | 10-2012-0080857 A | | 7/2012 | |

(Continued)

*Primary Examiner* — Karl Kurple
(74) *Attorney, Agent, or Firm* — Lewis Roca Rothgerber Christie LLP

(57) ABSTRACT

A division mask includes a main body including at least one opening pattern, and a clamping portion at an edge of the main body, the clamping portion having an increasing width with respect to an increasing distance from the main body, and the clamping portion including a fan-out portion extending from the main body and including at least one dummy pattern, and at least one branch portion having a decreasing width with respect to an increasing distance from the fan-out portion.

20 Claims, 8 Drawing Sheets

(56) References Cited

U.S. PATENT DOCUMENTS

| | | | | |
|---|---|---|---|---|
| 2009/0297768 A1* | 12/2009 | Ko | ............... | B23K 31/02 |
| | | | | 428/136 |
| 2012/0174863 A1* | 7/2012 | Park | ............... | C23C 14/042 |
| | | | | 118/504 |
| 2012/0240850 A1* | 9/2012 | Kobayashi | ............ | C23C 14/042 |
| | | | | 118/504 |
| 2012/0279444 A1 | 11/2012 | Hong | | |
| 2012/0279445 A1* | 11/2012 | Kim | ............... | H01L 51/0011 |
| | | | | 118/504 |
| 2012/0282445 A1* | 11/2012 | Kim | ............... | C23C 14/042 |
| | | | | 428/209 |
| 2014/0065355 A1* | 3/2014 | Kang | ............... | C23C 14/042 |
| | | | | 428/136 |
| 2014/0141556 A1* | 5/2014 | Lee | ............... | H01L 51/0011 |
| | | | | 438/34 |
| 2014/0331926 A1* | 11/2014 | Kim | ............... | B23K 37/0408 |
| | | | | 118/504 |
| 2015/0047560 A1* | 2/2015 | Kang | ............... | C23C 14/042 |
| | | | | 118/504 |
| 2016/0122860 A1* | 5/2016 | Kim | ............... | C23C 14/042 |
| | | | | 118/505 |
| 2016/0343944 A1* | 11/2016 | Lee | ............... | H01L 27/3223 |
| 2018/0074394 A1* | 3/2018 | Kim | ............... | G03F 1/20 |
| 2019/0319190 A1* | 10/2019 | Nakamura | ............ | H01L 51/001 |
| 2019/0386066 A1* | 12/2019 | Cai | ............... | H01L 21/77 |
| 2020/0083451 A1* | 3/2020 | Ha | ............... | C23C 14/042 |

FOREIGN PATENT DOCUMENTS

| | | |
|---|---|---|
| KR | 10-2012-0123918 A | 11/2012 |
| KR | 10-2012-0125035 A | 11/2012 |
| KR | 10-2014-0062790 A | 5/2014 |

\* cited by examiner

DIVISION MASK WITH CLAMPING PORTION

CROSS-REFERENCE TO RELATED APPLICATION

Korean Patent Application No. 10-2016-0114309, filed on Sep. 6, 2016, in the Korean Intellectual Property Office (KIPO), and entitled: "Division Mask," is incorporated by reference herein in its entirety.

BACKGROUND

1. Field

Exemplary embodiments relate to a division mask, and more particularly, to a division mask capable of substantially preventing waves.

2. Discussion of Related Art

An organic light emitting diode ("OLED") display device is a self-luminous display device that displays an image using an OLED that emits light. The OLED display device does not require a separate light source, which is dissimilar to a liquid crystal display ("LCD") device, and thus has relatively small thickness and weight. In addition, the OLED display devices are currently garnering attention as a next generation display device of portable electronic devices by virtue of their characteristics, e.g., low power consumption, high luminance, and high response speed.

The OLED display device has a stacked structure in which a light emitting layer is interposed between an anode and a cathode. Holes and electrons that are respectively injected into the anode and the cathode recombine in the light emitting layer such that light is emitted to realize color. However, since it is difficult to obtain highly efficient light emission with the above-described structure, an intermediate layer, e.g., an electron injection layer, an electron transport layer, a hole transport layer and a hole injection layer, is selectively inserted and used between each electrode and the light emitting layer.

Meanwhile, the intermediate layer including electrodes and the light emitting layer of the OLED display device may be formed by various methods, one of which is a deposition method. A fine metal mask ("FMM") having a substantially same pattern as that of a thin film to be formed on a substrate is used to manufacture an OLED display device using a deposition method. The FMM is aligned on the substrate and a thin film forming material is deposited to pattern a thin film on the substrate.

SUMMARY

According to an exemplary embodiment, a division mask may include a main body having at least one opening pattern, and a clamping portion at an edge of the main body, the clamping portion having an increasing width with respect to an increasing distance from the main body, and the clamping portion including a fan-out portion extending from the main body and including at least one dummy pattern, and at least one branch portion having a decreasing width with respect to an increasing distance from the fan-out portion.

The branch portion may include an end portion having an outer side surface parallel to an outer side surface of the main body.

The branch portion may include a first branch portion and a second branch portion.

The first branch portion may be bilaterally symmetrical with the second branch portion.

A width between an inner side end of the first branch portion and an inner side end of the second branch portion may be larger than a width of the main body.

Each of the first branch portion and the second branch portion may have an angle of about 135° or more and about 180° or less with respect to the main body.

The dummy pattern may have a substantially same shape as a shape of the opening pattern.

The main body and the clamping portion may include a metal.

The division mask may further include a joint portion between the main body and the clamping portion.

According to another exemplary embodiment, a division mask may include a main body including an opening pattern; and a clamping portion at opposite ends of the main body, the clamping portion including a dummy pattern. The main body includes a central portion at the center of the main body and has a wider width from the central portion toward the opposite ends.

The clamping portion may include a first branch portion and a second branch portion.

The first branch portion may be bilaterally symmetrical with the second branch portion.

Each of the first branch portion and the second branch portion may have an angle of about 135° or more and about 180° or less with respect to the main body.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
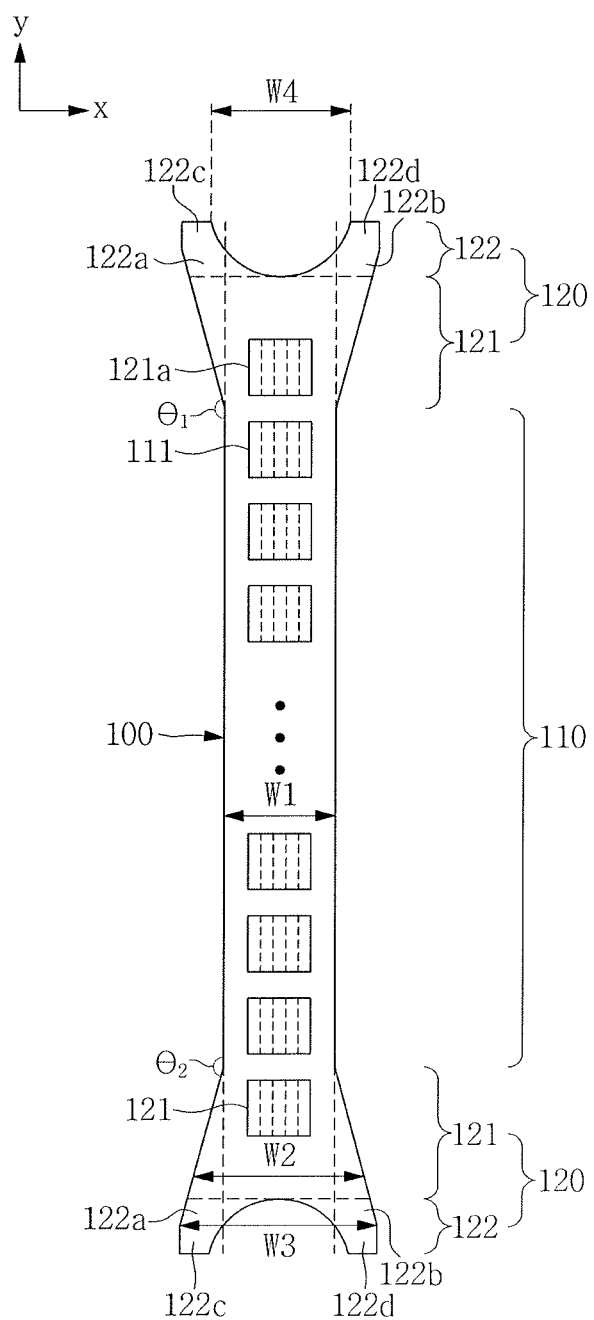
FIG. 1 illustrates a plan view of a division mask according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer or element is referred to as being "between" two layers, it can be the only layer between the two layers, or one or more intervening layers may also be present. Further, when a layer or element is referred to as being "connected" to another element, the element is "directly connected" to the other element, or "electrically connected" to the other element with one or more intervening elements interposed therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and accordingly the spatially relative terms may be interpreted differently depending on the orientations.

It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Accordingly, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe exemplary embodiments, and like reference numerals refer to like elements throughout the specification.

Hereinafter, a division mask according to an exemplary embodiment will be described with reference to FIGS. 1, 2, 3A, 3B, 3C, and 3D.

FIG. 1 is a plan view illustrating a division mask according to an exemplary embodiment.

Referring to FIG. 1, a division mask 100 may include a main body 110 and a clamping portion 120. The division mask 100 may include a metal, e.g., nickel (Ni), cobalt (Co), a nickel alloy, a nickel-cobalt alloy, stainless steel (SUS) and invar.

The main body 110 of the division mask 100 may include an opening pattern 111, e.g., the main body 110 may have a linear shape along the y-axis, e.g., along a first direction, with an opening pattern 111 therethrough. The opening pattern 111 may be positioned along a longitudinal y-axis of the division mask 100, e.g., a plurality of opening patterns 111 may be spaced apart from each other along the longitudinal direction of the main body 110. Each opening pattern 111 may include a plurality of fine opening patterns. Each of the plurality of fine opening patterns may be formed into a shape corresponding to a thin film shape to be deposited on a substrate disposed on the plurality of division masks 100. Accordingly, a deposition material may be deposited, during a deposition process, on the substrate through the fine opening patterns (of a corresponding opening pattern 111) to form a desired shape of the thin film. For example, the opening pattern 111 may be quadrangular as illustrated in the drawings, but exemplary embodiments are not limited thereto, e.g., the opening pattern 111 may have any suitable form.

The clamping portion 120 may be positioned at an edge of the main body 110, e.g., two clamping portions 120 may be spaced apart from each other along the longitudinal direction of the main body 110, e.g., along the y-axis, to be attached to opposite ends of the main body 110. The clamping portion 120 may include a fan-out portion 121 and at least one branch portion 122.

The clamping portion 120 has a larger width than that of the main body 110 along the x-axis, e.g., along a second direction perpendicular to the first direction. For example, a width W2 of the clamping portion 120 is larger than a width W1 of the main body 110 (W1<W2). In addition, the clamping portion 120 has an increasing width, as a distance from the main body 110 increases. For example, a width W3 of a portion of the clamping portion 120 relatively far from the main body 110 is larger than a width W2 of a portion of the clamping portion 120 relatively close to the main body 110 (W2<W3). Accordingly, a tensile force acting on the clamping portion 120 acts not only along the longitudinal direction of the division mask 100, but also along a width direction thereof. Accordingly, wave generation may be suppressed in the division mask 100, thus improving patterning accuracy.

The fan-out portion 121 of the clamping portion 120 may be attached, e.g., directly, to an edge of the main body 110. For example, as illustrated in FIG. 1, the fan-out portion 121 may have a trapezoidal cross-section in plan view, so the shorter base of the trapezoidal cross-section may be attached to the edge of the main body 110, with sides of the trapezoidal cross-section extending away from the shorter base toward the at least one branch portion 122.

The fan-out portion 121 may have an angle of about 135° or more and about 180° or less with respect to the main body 110, e.g., the angle between the sides of the trapezoidal cross-section and the outer lateral sides of the main body 110 as measured along the exterior of the division mask 100. For example, the angle between the fan-out portion 121 and the main body 110 is defined as a first angle θ1 between a left side end of the fan-out portion 121 at an upper end of the main body 110 and a left side end of an upper end portion of the main body 110, and a second angle θ2 between a left side end of the fan-out portion 121 at a lower end of the main body 110 and a left side end of a lower end portion of the main body 110. The angle between the fan-out portion 121 and the main body 110, i.e., each of the first and second angles θ1 and θ2, may be about 135° or more and about 180° or less. For example, the first and second angles θ1 and θ2 may be equal to each other, but embodiments are not limited thereto.

The fan-out portion 121 may include at least one dummy pattern 121a. The dummy pattern 121a may have a substantially same shape as that of the opening pattern 111 described above. For example, the dummy pattern 121a, similar to the opening pattern 111, may include a plurality of fine dummy patterns. The dummy pattern 121a may be quadrangular as illustrated in the drawings, but exemplary embodiments are not limited thereto, and the dummy pattern 121a may have any suitable shape. The dummy pattern 121a according to an exemplary embodiment is positioned at the clamping portion 120 and suppresses wave generation in the opening pattern 111. Accordingly, the patterning accuracy of the division mask 100 may be improved.

The branch portion 122 may be attached to the fan-out portion 121, e.g., the branch portion 122 may extend from the longer base of the trapezoidal cross-section of the fan-out portion 121 (from the dashed line in FIG. 1). The branch portion 122 and fan-out portion 121 may be integral with each other, i.e., a single and seamless element, that is merely described in two parts for convenience of description.

The branch portion 122 may include a first branch portion 122a and a second branch portion 122b. Each of the first and second branch portions 122a and 122b may have a decreasing width, as a distance from the fan-out portion 121 increases. For example, the first branch portion 122a has a smaller width, as a distance from the fan-out portion 121 increases, and the second branch portion 122b has a smaller width, as a distance from the fan-out portion 121 increases.

The branch portion 122 may include end portions 122c and 122d having outer side surfaces, i.e., lateral side surfaces along the y-axis, that are parallel to the main body 110. For example, the first branch portion 122a may include a first end portion 122c, and the second branch portion 122b may include a second end portion 122d. In such an exemplary embodiment, the outer lateral side surface of the first branch portion 122a is parallel to the outer lateral side surface of the main body 110, and the outer lateral side surface of the second branch portion 122b is parallel to the outer lateral side surface of the main body 110.

The first branch portion 122a and the second branch portion 122b are spaced apart from each other along the x-axis. For example, the first branch portion 122a and the second branch portion 122b may be spaced apart from each other by a gap greater than a width of the main body 110. For example, a width W4 between an inner side end of the first branch portion 122a and an inner side end of the second branch portion 122b is greater than the width W1 of the main body 110. For example, as illustrated in FIG. 1, the gap between the first and second branch portions 122a and 122b may have a semi-circular shape in plan view, so the decreasing width of each of the first and second branch portions 122a and 122b may be along the curve of the gap. Accordingly, a tensile force acts not only in the longitudinal direction of the division mask 100 but also in the width direction thereof, such that wave generation may be suppressed, thus improving the patterning accuracy.

The clamping portion 120 may be bilaterally symmetrical. For example, an angle between a left side of the fan-out portion 121 and the main body 110 may be substantially equal to an angle between a right side of the fan-out portion 121 and the main body 110. In addition, a shape of the first branch portion 122a and a shape of the second branch portion 122b may be substantially identical to each other, and a width of the first branch portion 122a and a width of the second branch portion 122b may be substantially equal to each other. Accordingly, a tensile force may act uniformly on the right and left side of the division mask 100, thus suppressing the wave generation.

Figure 2:
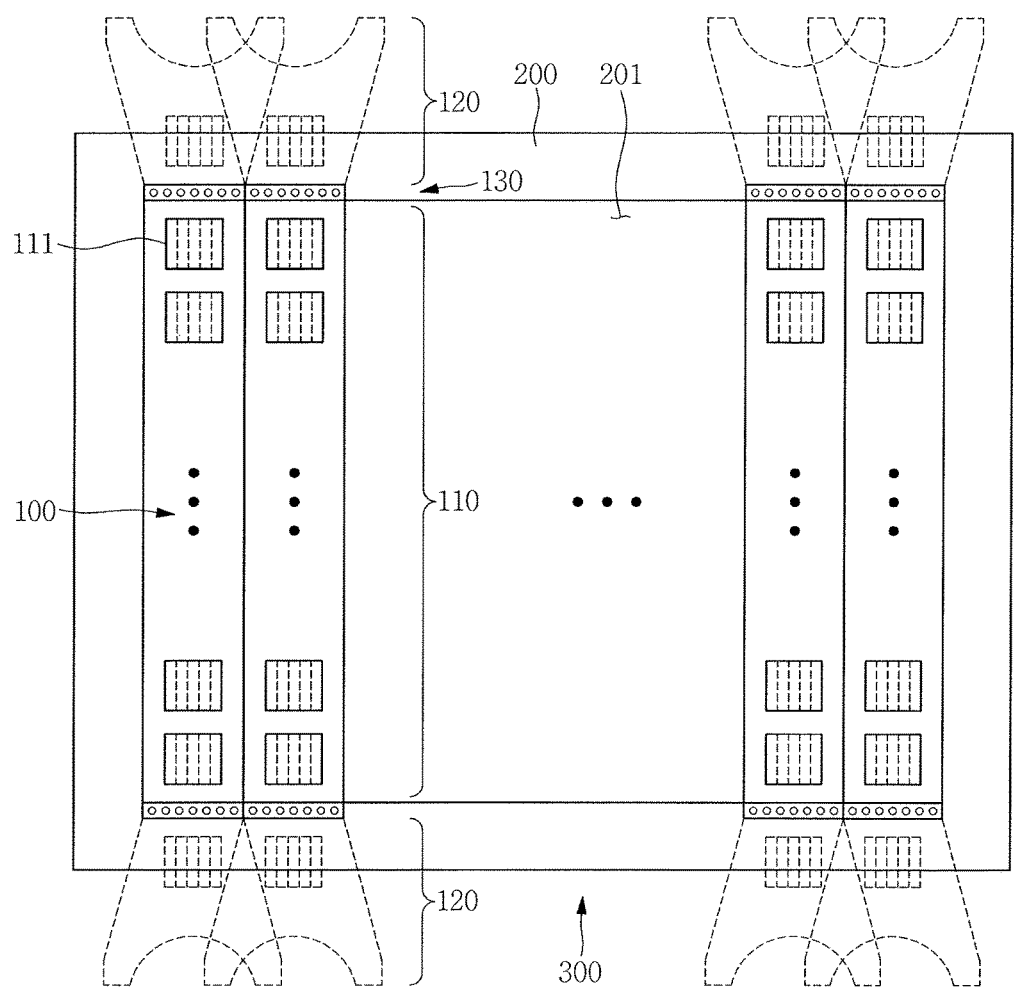
FIG. 2 illustrates a plan view of a mask frame assembly including a division mask according to an exemplary embodiment.

FIG. 2 is a plan view illustrating a mask frame assembly including the division mask 100.

Referring to FIG. 2, a mask frame assembly 300 may include a plurality of the division masks 100, from which the clamping portions 120 are removed, on a frame 200. That is, when the plurality of division masks 100 are fixed to the frame 200, the clamping portions 120 are removed (indicated by dashed lines in FIG. 2).

The division mask 100 may further include a joint portion 130. The joint portion 130 may be positioned between the main body 110 and the clamping portion 120 described above. As illustrated in FIG. 2, the joint portion 130 is welded to the frame 200 to fix the division mask 100 to the frame 200.

The frame 200 may include an opening area 201 positioned at the center thereof, and the frame 200 may have, e.g., a quadrangular loop shape. The opening area 201 may overlap the division mask 100 described above, e.g., the plurality of division masks 100 may be attached to the frame 200 over the opening area 201. The frame 200 may include a metal material having high rigidity in order to substantially minimize deformation caused by compressive force or heat applied on the frame 200. For example, a metal such as stainless steel may be included.

FIGS. 3A, 3B, 3C and 3D are views illustrating stages in a method of manufacturing the mask frame assembly 300 including the division mask 100.

Figure 3A:
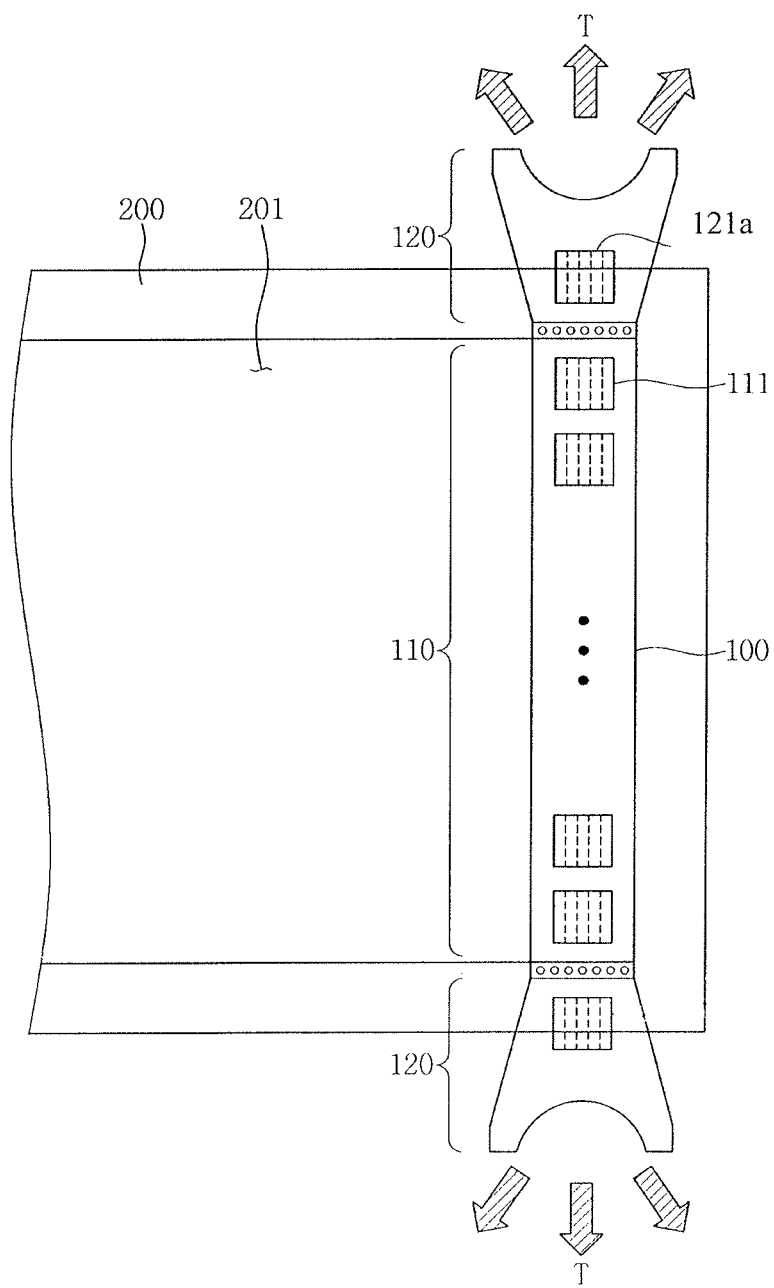
FIGS. 3A, 3B, 3C and 3D illustrate views of stages in a method of manufacturing a mask frame assembly including a division mask according to an exemplary embodiment.

FIG. 3A is a view illustrating a process of fixing a first division mask 100 to the frame 200. Referring to FIG. 3A, the clamping portion 120 is held by a tensioning apparatus, and a tensile force T acts in a longitudinal direction of the division mask 100. In such an exemplary embodiment, the tensile force T may act not only in the longitudinal direction of the division mask 100 but also in a width direction of the division mask 100 due to the clamping portion 120 having a wider width than a width of the main body 100. Accordingly, wave generation may be substantially suppressed in the division mask 100, and the patterning accuracy may be improved.

Subsequently, the joint portion 130 is welded to the frame 200 to fix the first division mask 100 to the frame 200. For example, the joint portion 130 may be between the opening pattern 111 on the main body 110 and the dummy opening pattern 121 on the clamping portion 120.

Figure 3B:
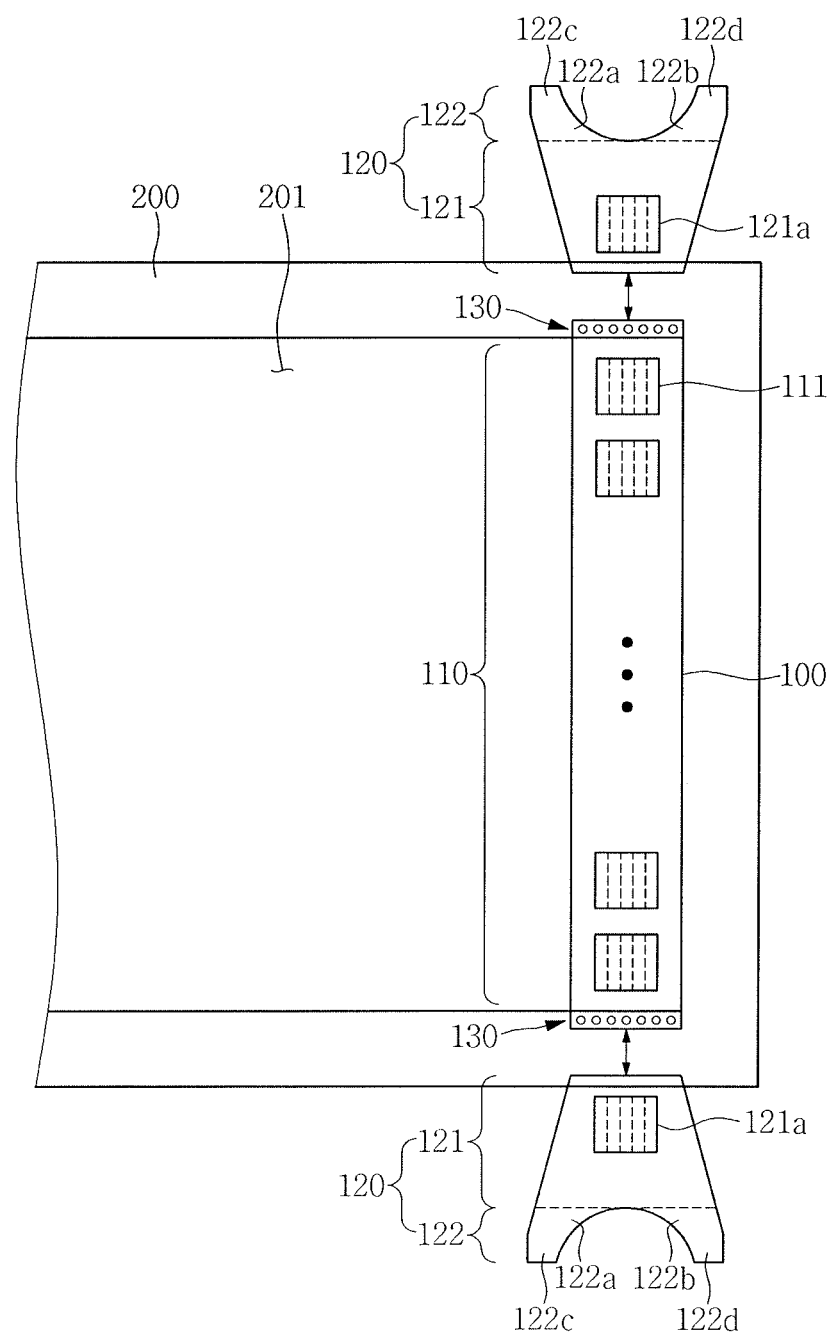

FIG. 3B is a view illustrating a process of removing the clamping portion 120. Referring to FIG. 3B, the clamping portion 120 is cut off to be removed. If the clamping portion 120 were to remain (instead of being cut off), the clamping portion 120 would have interfered with an adjacent division mask 100, since the width of the clamping portion 120 is larger than the width of the main body 110.

Figure 3C:
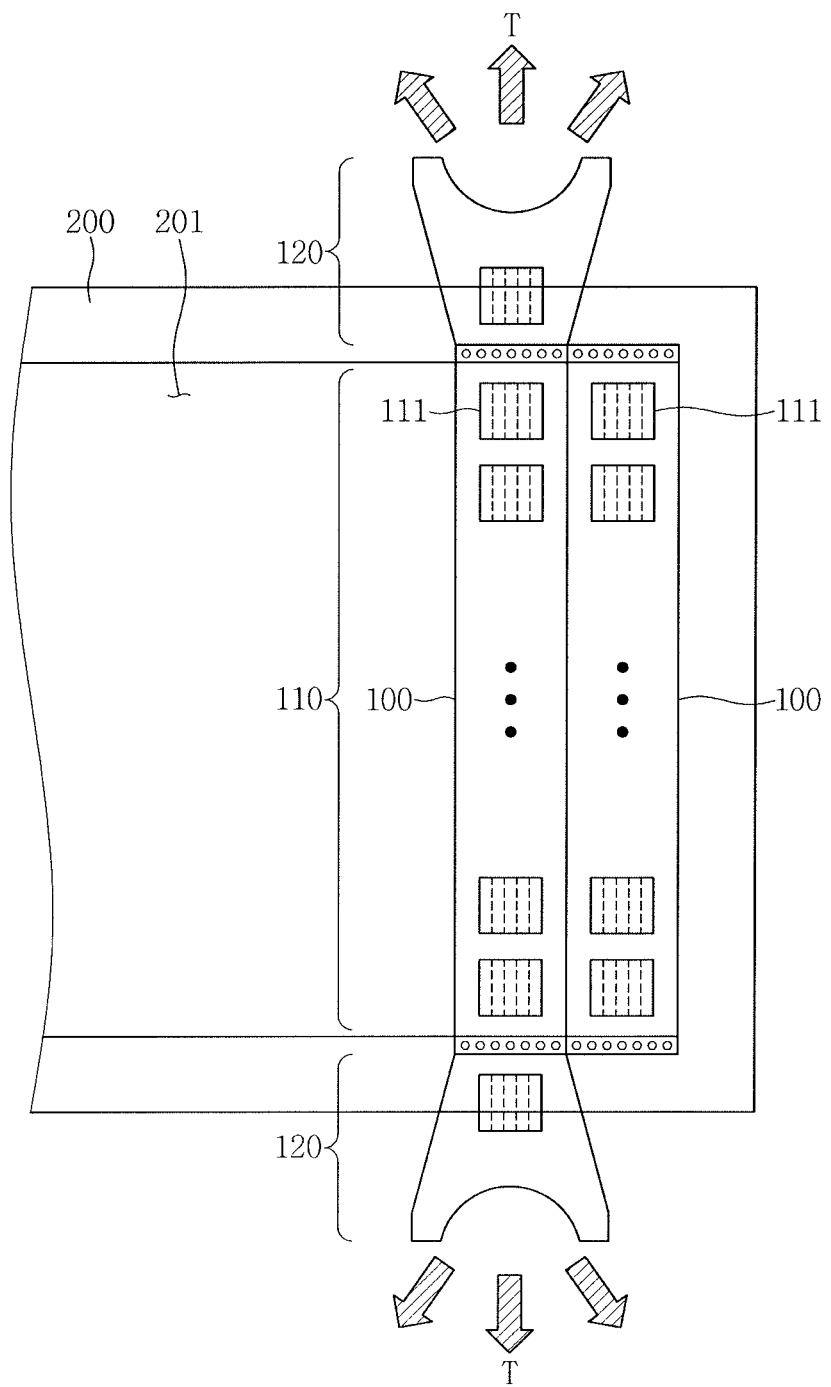

FIG. 3C is a view illustrating a process of coupling a second division mask 100 to the frame 200. Referring to FIG. 3C, the clamping portion 120 is held by a tensioning apparatus, and a tensile force T acts on opposite ends of the division mask 100. In such an exemplary embodiment, the tensile force T acts not only in the longitudinal direction of the division mask 100 but also in the width direction of the division mask 100 due to the clamping portion 120 having a wider width than that of the main body 100. Accordingly, the wave generation may be suppressed in the division mask 100, and the patterning accuracy may be improved.

Figure 3D:
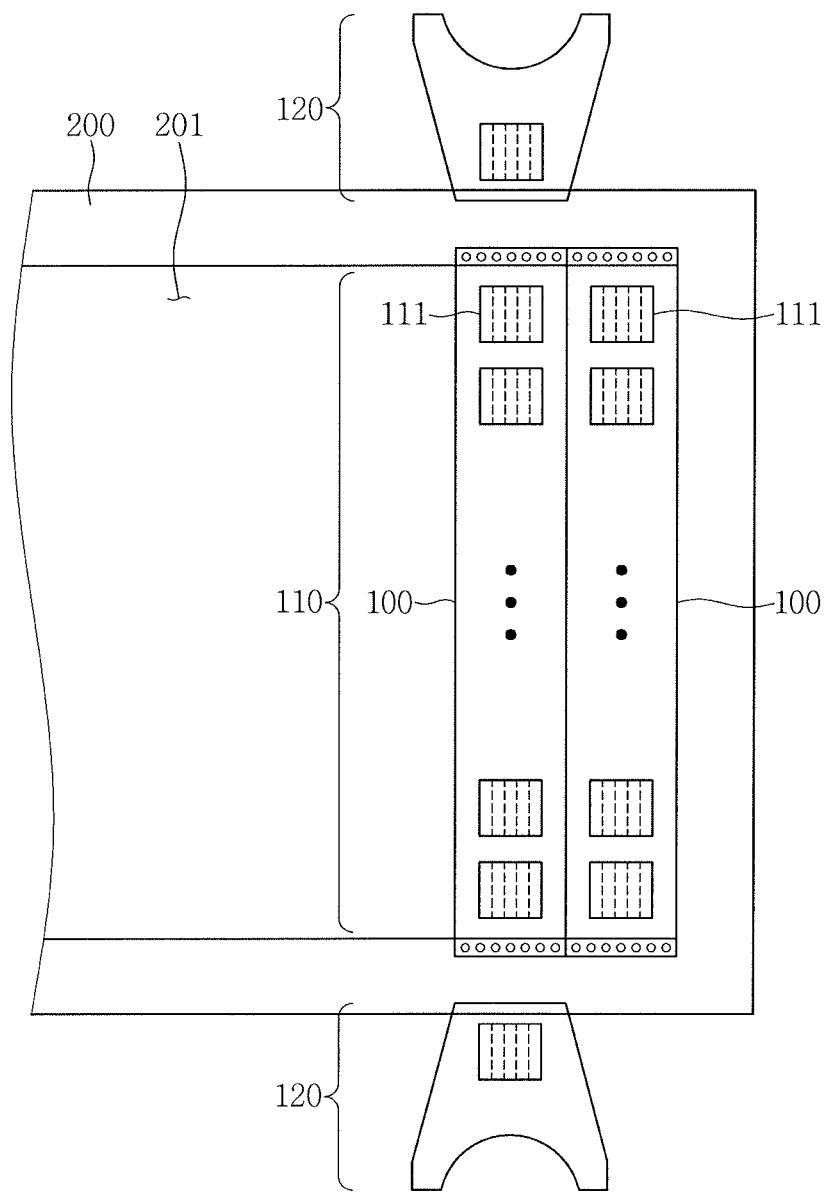

FIG. 3D is a view illustrating a process of removing the clamping portion 120. Referring to FIG. 3D, the clamping portion 120 is cut off to be removed. If not cut off, the clamping portion 120 may interfere with another division mask 100, since the width of the clamping portion 120 is larger than the width of the main body 110.

The plurality of division masks 100 may be attached in a similar way to the frame 200 to cover the entire opening area 201. When the division masks 100 are fixed to the frame 200 in the above-described manner, the mask frame assembly 300 is provided as illustrated in FIG. 2.

A wave generation simulation of the division mask 100 according to embodiments was compared to a wave generation simulation of a comparative mask, i.e., a mask having a width of the main body the same as a width of the clamping portion. Results of the wave generation simulation are illustrated in the following Table 1.

TABLE 1

| Wave (μm) | Comparative Example (μm) | Exemplary Embodiment (μm) |
|---|---|---|
| Max | 55.7 | 21.7 |
| Min | −48.8 | −36.6 |
| Max − Min | 104.5 | 58.3 |

As can be seen in Table 1 above, wave of the division mask 100 according to an exemplary embodiment is reduced by about 44%, as compared with wave of the comparative division mask. It is noted that the value of "Max" refers to a highest point of a resultant wave above a plane of the mask, the value of "Min" refers to a lowest point of a resultant wave below a plane of the mask, and the value of "Max-Min" refers to a difference between the highest and lowest points. It is further noted that the plane of the mask is considered to be at zero μm relative to the measurements in Table 1.

Hereinafter, a division mask according to another exemplary embodiment will be described in detail with reference to FIG. 4.

The descriptions related to the division mask according to an exemplary embodiment will be omitted from the descriptions of the division mask according to an alternative exemplary embodiment.

Figure 4:
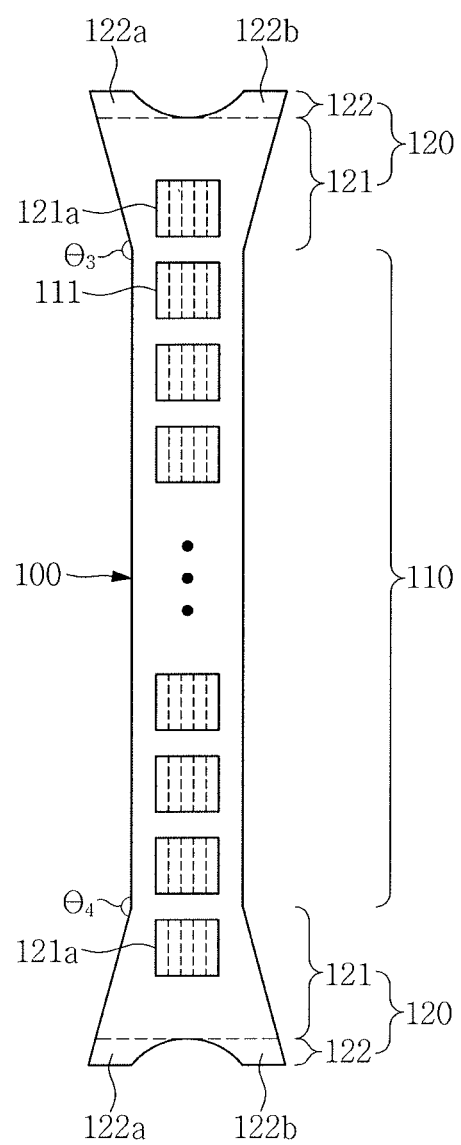
FIG. 4 illustrates a plan view of a division mask according to another exemplary embodiment.

FIG. 4 is a plan view illustrating a division mask according to another exemplary embodiment.

Referring to FIG. 4, the fan-out portion 121 may have an angle of about 135° or more and about 180° or less with respect to the main body 110. For example, an angle between the fan-out portion 121 and the main body 110 is defined as a third angle θ3 between a left side end of the fan-out portion 121 at an upper end of the main body 110 and a left side end of an upper end portion of the main body 110, and a fourth angle θ4 between a left side end of the fan-out portion 121 at a lower end of the main body 110 and a left side end of a lower end portion of the main body 110. The angle between the fan-out portion 121 and the main body 110, i.e., either one of the third and fourth angles θ3 and θ4, may be about 135° or more and about 180° or less.

According to the present exemplary embodiment, as compared to the branch portion 122 in FIG. 1, the end portions 122c and 122d having outer side surfaces parallel to the main body 110 may be omitted. In other words, as illustrated in FIG. 4, the branch portion 122 may extend from the fan-out portion 121 along an angle between the fan-out portion 121 and the main body 110. That is, a lateral side of the branch portion 122 may be collinear with a lateral side of the fan-out portion 121.

Figure 5:
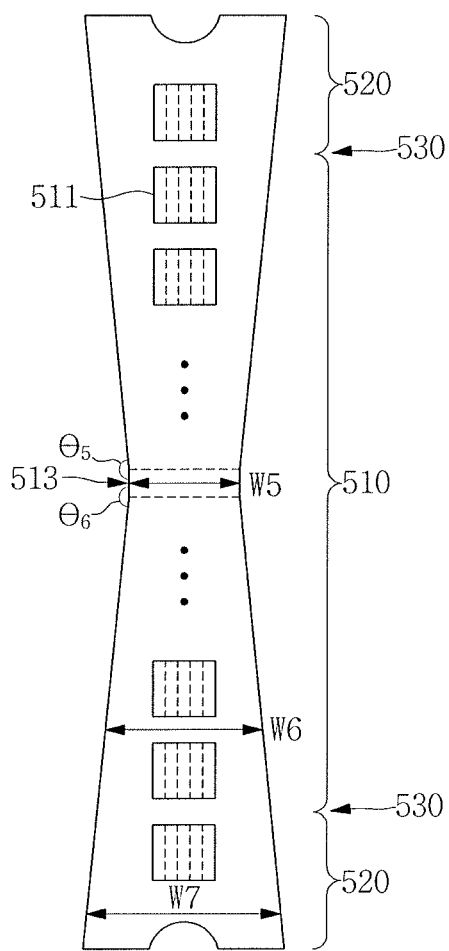
FIG. 5 illustrates a plan view of a division mask according to another exemplary embodiment.

Hereinafter, a division mask according to another exemplary embodiment will be described in detail with reference to FIG. 5. FIG. 5 is a plan view illustrating a division mask 500 according to another exemplary embodiment.

Referring to FIG. 5, the division mask 500 may include a main body 510, a clamping portion 520, and a joint portion 530. The main body 510 may include a central portion 513.

As illustrated in FIG. 5, the central portion 513 is positioned at the center of the main body 510. The division mask 500 has a smallest width W5 at the central portion 513 and has a wider width toward opposite ends of the division mask 500. That is, the division mask 500 has a wider width, as further away from the central portion 513. For example, a width W6 of a portion of the division mask 500 relatively far from the central portion 513, i.e., of a portion of the main body 510 illustrated in FIG. 5, is larger than a width W5 of a portion of the division mask 500 relatively close to the central portion 513. For example, as illustrated in FIG. 5, the division mask 500 has a gradually, e.g., and continuously, increasing width from the central portion 513 to an end, e.g., edge, of the clamping portion 520, e.g., the main body 510 may have a continuously increasing width from the central portion 513 toward an end of the clamping portion 520 to have its lateral surfaces colinear with respective lateral surfaces of the clamping portion 520. Since the division mask 500 has a wider width as a distance from the central portion 513 increases, when a tensile force acts along a longitudinal direction of the division mask 500, the tensile force acts not only along the longitudinal direction of the division mask 500, but also along a width direction thereof. Accordingly, the wave generation may be suppressed in the division mask 500 and the patterning accuracy may be improved.

According to the present exemplary embodiment, the central portion 513 may have an angle of about 135° or more and about 180° or less with respect to the main body 510. For example, as illustrated in FIG. 5, an angle between the central portion 513 and the main body 510 is defined as an angle θ5 between a left side end of the main body 510 at an upper end of the central portion 513 and a left side end of the central portion 513, and an angle θ6 between a left side end of the main body 510 at a lower end of the central portion 513 and the left side end of the central portion 513. The angle between the central portion 513 and the main body 510, either one of the angles θ5 and θ6, may be about 135° or more and about 180° or less.

By way of summation and review, when a fine metal mask is made large, an etching error for pattern formation may increase, and the central portion of the mask may sag due to its own weight. Accordingly, a mask frame assembly may be used by attaching a plurality of stick-shaped division masks to a frame. However, when such a division mask is attached to the frame, a tensile force acts in the longitudinal direction of the division mask, thereby generating waves in the division mask.

In contrast, exemplary embodiments are directed to a division mask capable of substantially preventing waves generated in a width direction of the division mask. That is, the wave generation may be substantially suppressed in the division mask, accordingly improving the patterning accuracy.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A division mask for a frame, comprising: a main body including at least one opening pattern; a clamping portion extending from an edge of the main body in a first direction; and
 a joint portion between the main body and the clamping portion, the joint portion being welded to the frame, and
 the clamping portion having an increasing width with respect to an increasing distance from the main body, and the clamping portion includes:
 a fan-out portion extending from the main body and including at least one dummy pattern, the at least one dummy pattern being only in the clamping portion among the clamping portion and the main body, and
 at least one branch portion extending from the fan-out portion and having a decreasing width with respect to an increasing distance from the fan-out portion, the fan-out portion being between the main body and the at least one branch portion,
 wherein a width in a second direction of an outermost tip of the at least one branch portion is smaller than at any other width of the clamping portion in the second direction, and the second direction is perpendicular to the first direction, and wherein a side of the clamping portion extends in a first direction continuously in a single straight line from the joint portion to the at least one branch portion.

2. The division mask as claimed in claim 1, wherein the at least one branch portion includes an end portion having an outer lateral side surface parallel to an outer side lateral surface of the main body, the outer lateral side surface of the end portion being perpendicular to the outermost tip of the at least one branch portion.

3. The division mask as claimed in claim 1, wherein the at least one branch portion includes a first branch portion and a second branch portion.

4. The division mask as claimed in claim 3, wherein the first branch portion is bilaterally symmetrical with the second branch portion.

5. The division mask as claimed in claim 3, wherein a width in the second direction between an inner side end of the first branch portion and an inner side end of the second branch portion is larger than a width in the second direction of the main body.

6. The division mask as claimed in claim 3, wherein each of the first branch portion and the second branch portion has an angle of 135° to 180° with respect to the main body.

7. The division mask as claimed in claim 1, wherein the at least one dummy pattern has a same shape as a shape of the opening pattern.

8. The division mask as claimed in claim 1, wherein the main body and the clamping portion include a metal.

9. The division mask as claimed in claim 1, wherein the joint portion is between the at least one opening pattern and the at least one dummy pattern.

10. The division mask as claimed in claim 9, wherein the fan-out portion of the clamping portion is directly connected to the joint portion, the fan-out portion having a trapezoidal cross section in plan view.

11. The division mask as claimed in claim 1, wherein the fan-out portion has a trapezoidal cross section in plan view, a shorter base of the trapezoidal cross section being connected to the main body.

12. A division mask for a frame, comprising:
 a main body including at least one opening pattern, the main body extending along a first direction; and
 clamping portions at opposite ends of the main body in the first direction, the clamping portions including dummy patterns, the dummy patterns being only in the clamping portions among the clamping portions and the main body,
 wherein the main body includes a central portion at a center of the main body between the opposite ends in the first direction, the main body having an increasing width in a direction oriented from the central portion toward the opposite ends, and
 wherein the width of the main body extends in a second direction perpendicular to the first direction, and the width of the main body increases continuously along the first direction from the central portion to the opposite ends at the respective clamping portions when the division mask is unattached to the frame.

13. The division mask as claimed in claim 12, wherein each clamping portion includes a first branch portion and a second branch portion.

14. The division mask as claimed in claim 13, wherein the first branch portion is bilaterally symmetrical with the second branch portion.

15. The division mask as claimed in claim 14, wherein each of the first branch portion and the second branch portion has an outer lateral surface colinear with a respective lateral surface of the main body.

16. The division mask as claimed in claim 7, wherein a size of the at least one dummy pattern is a same size as a size of the at least one opening pattern.

17. The division mask as claimed in claim 16, wherein a length of the fan-out portion along a longitudinal direction of the main body is longer than a length of the at least one dummy pattern along the longitudinal direction of the main body.

18. The division mask as claimed in claim 16, wherein each of the at least one opening pattern and the at least one dummy pattern includes a plurality of fine opening patterns, each of the plurality of fine opening patterns having a shape corresponding to a thin film shape to be deposited on a substrate.

19. The division mask as claimed in claim 1, wherein:
 the at least one opening pattern in the main body includes a plurality of opening patterns, the plurality of opening patterns being spaced apart from each other along a longitudinal direction of the main body, and
 the at least one dummy pattern is spaced apart from the plurality of opening patterns along the longitudinal direction of the main body to be only in the clamping portion among the clamping portion and the main body.

20. The division mask as claimed in claim 12, wherein:
 the at least one opening pattern in the main body includes a plurality of opening patterns, the plurality of opening patterns being spaced apart from each other along a longitudinal direction of the main body, and
 each clamping portion of the clamping portions includes a single dummy pattern, the single dummy pattern being spaced apart from the plurality of opening patterns along the longitudinal direction of the main body.

* * * * *